United States Patent [19]
Ligtenberg et al.

[11] Patent Number: 6,005,716
[45] Date of Patent: *Dec. 21, 1999

[54] CO-LINEAR AND INTERSECTING FIVE LIGHT BEAM GENERATOR

[75] Inventors: Christiaan Ligtenberg, San Carlos; Joseph F. Rando, Los Altos Hills; Timothy J. Litvin, Santa Cruz, all of Calif.

[73] Assignee: LeveLite Technology, Inc., Mt. View, Calif.

[*] Notice: This patent is subject to a terminal disclaimer.

[21] Appl. No.: 08/887,778

[22] Filed: Jul. 3, 1997

[51] Int. Cl.⁶ .............................. G02B 27/10; G03F 9/00
[52] U.S. Cl. .............................. 359/618; 359/636; 430/5
[58] Field of Search .................... 359/618, 627, 359/628, 629, 633, 636, 471, 482; 430/5, 945; 356/138, 149

[56] References Cited

U.S. PATENT DOCUMENTS

| | | | |
|---|---|---|---|
| 2,422,376 | 6/1947 | Turner et al. | 359/629 |
| 3,488,104 | 1/1970 | Doherty | 359/629 |
| 4,283,115 | 8/1981 | Fraissl | 359/629 |
| 5,500,524 | 3/1996 | Rando | 250/216 |
| 5,617,202 | 4/1997 | Rando | 356/138 |

OTHER PUBLICATIONS

Robinson et al, "Optically Coupling Tunable Diode Lasers", NASA Tech Briefs, vol. 4, No. 1, Spring 1979.

*Primary Examiner*—Huy Mai
*Attorney, Agent, or Firm*—Thomas M. Freiburger

[57] ABSTRACT

A system which is preferably employed in a laser alignment instrument produces up to five orthogonal beams from a single laser diode beam. The optics take advantage of the elliptical shape of the beam from a laser diode to produce a plurality of masked, parallel collimated beams which are then reflected by combinations of 45°-angled and 90°-angled mirrors, some fully reflective and some partially transmissive, to produce the orthogonal beams.

9 Claims, 3 Drawing Sheets

CO-LINEAR AND INTERSECTING FIVE LIGHT BEAM GENERATOR

BACKGROUND OF THE INVENTION

This invention is concerned with laser diodes and more specifically with the efficient generation of five intersecting laser beams which are mutually orthogonal. These beams are used in alignment applications where the beams represent reference lines. Other beam generators are described in U.S. Pat. Nos. 5,500,524 and 5,617,202 assigned to the assignee of this invention and the disclosures of those patents are incorporated herein by reference in this application.

Generally, visible laser diodes have a much wider divergence in the direction perpendicular to the junction than that parallel to the junction. Typical values are 35° in one axis and 10° in the other. Normally, the central zone or portion of the beam is apertured to produce a beam which is nearly round, cropping a portion of the beam's power. If other beams are required, a beam splitter and subsequent optics are used to manipulate the newly created beam. The present invention uses the elliptical shape of the collimated beam from a diode laser with masks to generate three parallel beams, which subsequently produce five beams of light by using partial reflection. The beams form an xyz coordinate system which can be used as reference lines.

DESCRIPTION OF THE DRAWINGS

The accompanying drawings, which are incorporated in and constitute part of the specification, schematically illustrate a preferred embodiment of the invention and, together with the general description given below, serve to explain the principles of the invention.

DESCRIPTION OF PREFERRED EMBODIMENTS

Figure 1:
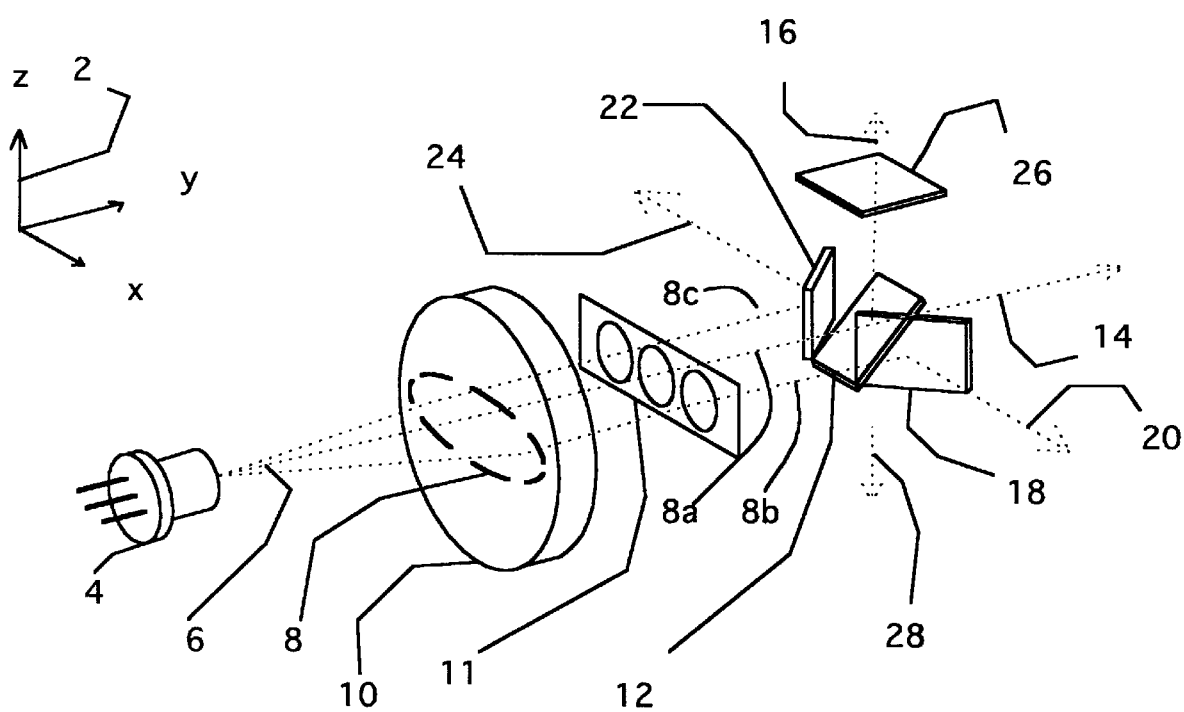
FIG. 1 schematically illustrates a general view of the invention showing how five intersecting laser beams are generated.

Referring now to the drawings, a preferred embodiment is shown in FIG. 1. Xyz coordinates of the system are designated by the number 2. A laser diode 4 is pointed along the y axis generating an elliptical beam 6, as is typical. The resulting elliptical profile on a lens 10 is indicated by a dotted line 8. The lens collimates the beam along the y axis, and the beam continues elliptical with the long axis of the ellipse shown horizontal in the figure.

Beyond the lens 10, a mask 11 with three holes, in a pattern aligned generally in a common plane with the long axis of the elliptical beam, defines three beams 8a, 8b and 8c. The central beam portion 8a strikes an oblique beam splitter 12 creating a transmitted beam output 14 along the y axis and a reflected beam output 16 along the z axis. The angle between the beam splitter 12 and the y axis is 45°.

A second portion of the beam 8b strikes a mirror 18 creating an output beam 20 which is directed along the x axis. Again, the angle between the mirror and the beam 8b is 45°. A remaining portion of the beam strikes another 45° mirror 22 creating a reflected output beam 24 which is aligned to the minus x axis. In this way four orthogonal output beams are generated.

To generate a fifth output beam, a partially reflecting mirror 26 is in the xy plane and reflects part of the beam 16 back along the z axis, in the minus z direction. Part of this beam is transmitted by the beam splitter 12 giving rise to an output beam 28 which travels along the minus z axis. This beam 28 is much weaker than the other beams but is sufficient to locate the intersection of the other beams for alignment purposes. For example, a reflection of 80% and 25% for the two beam splitters 12 and 26 gives rise to a z-directed beam of 60% of the central zone (8a) power and a minus z-directed beam of 16%. The transmitted y-directed beam 16 has 20% of the central zone power; 4% is lost by reflection back toward the mask and diode. Since the power is highest in the center there is still sufficient power to be useful. In this way five orthogonal beams are generated.

Figure 2:
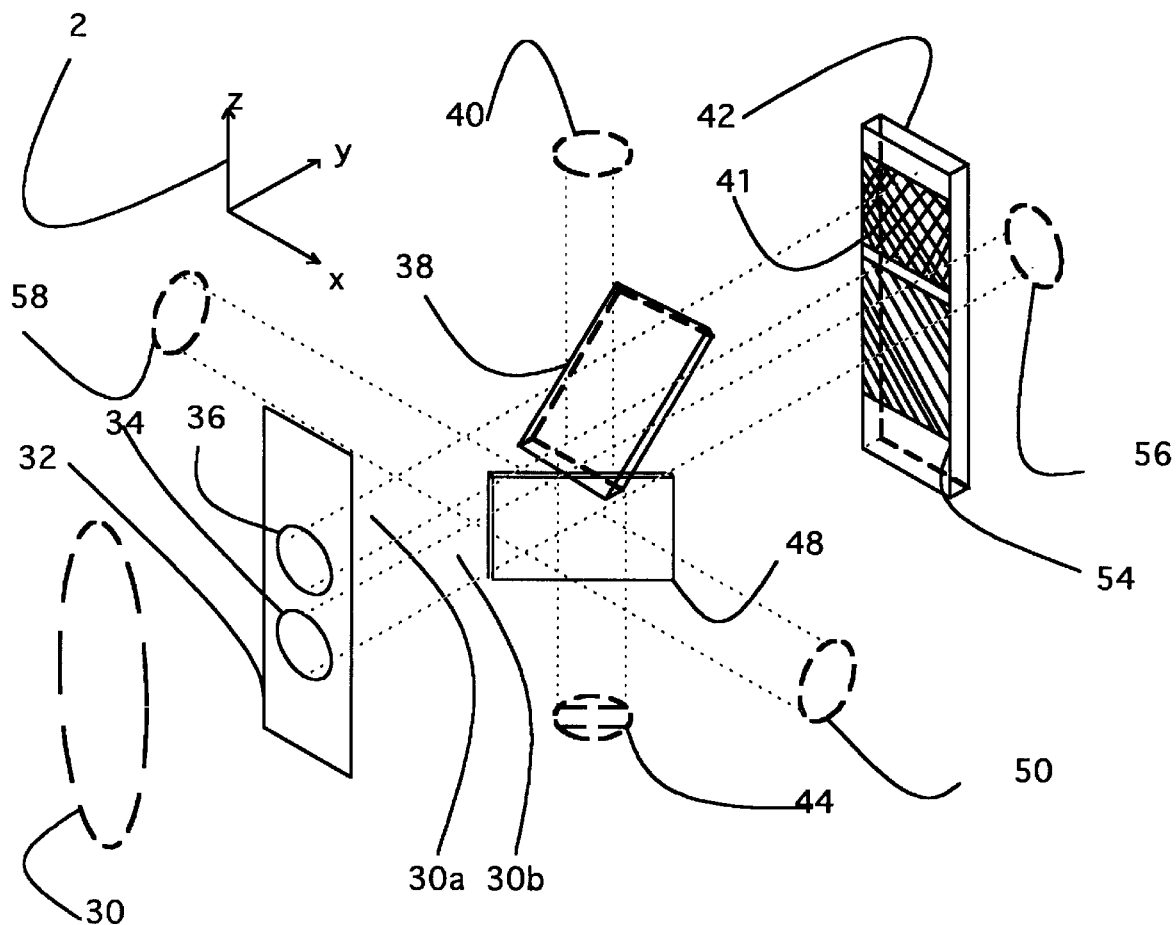
FIG. 2 schematically illustrates an alternate method used to generate five intersecting beams.

In FIG. 2, showing another embodiment, the same xyz coordinate system is used to describe the beam generating process. The elliptical beam 30 from a laser diode is apertured by a mask 32 with circular holes 34 and 36. The upper beam 30a generated by the hole 36 is reflected by a 45° beam splitter 38 generating an output beam 40 which propagates along the +z axis. The transmitted portion of the beam is fully reflected by a mirror coating 41 of a glass substrate 42 back to the beam splitter 38 where it is reflected by a back side reflective coating, along the −z axis, forming an output beam 44. This beam is obstructed by the edge of a lower beam splitter 48. Nevertheless, there is sufficient laser power to make this beam visible at short distances.

The beam 30b which is generated by the mask hole 34 strikes the 45°-angled beam splitter 48 producing a reflected output beam 50 propagating along the x axis and a transmitted portion which strikes a reflecting/transmitting coating 54 on the substrate 42, creating a transmitted output beam 56 and reflecting a portion back to the beam splitter 48 (the back of which is reflective), where it generates an output beam 58 propagating in the minus x direction.

Figure 3A:
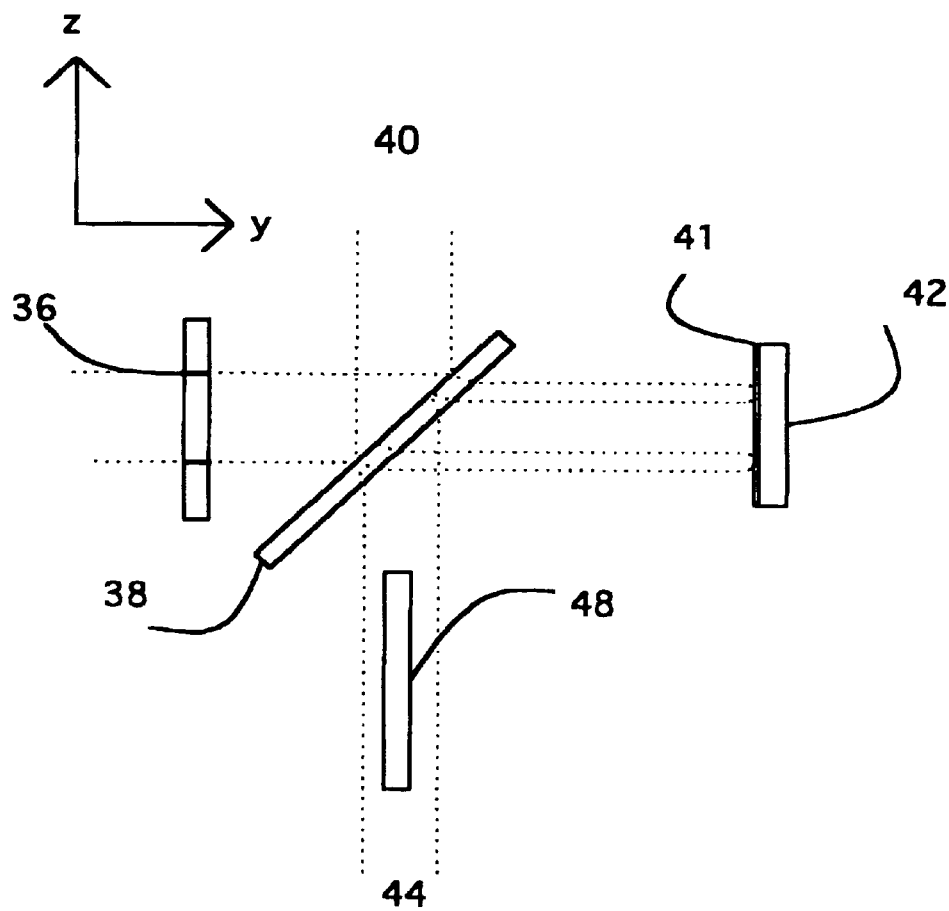
FIG. 3A is an orthographic, schematic view of the system of FIG. 2 looking along the x axis as represented in FIG. 2, i.e., a right side elevation view of the system as seen in FIG. 2.
Figure 3B:
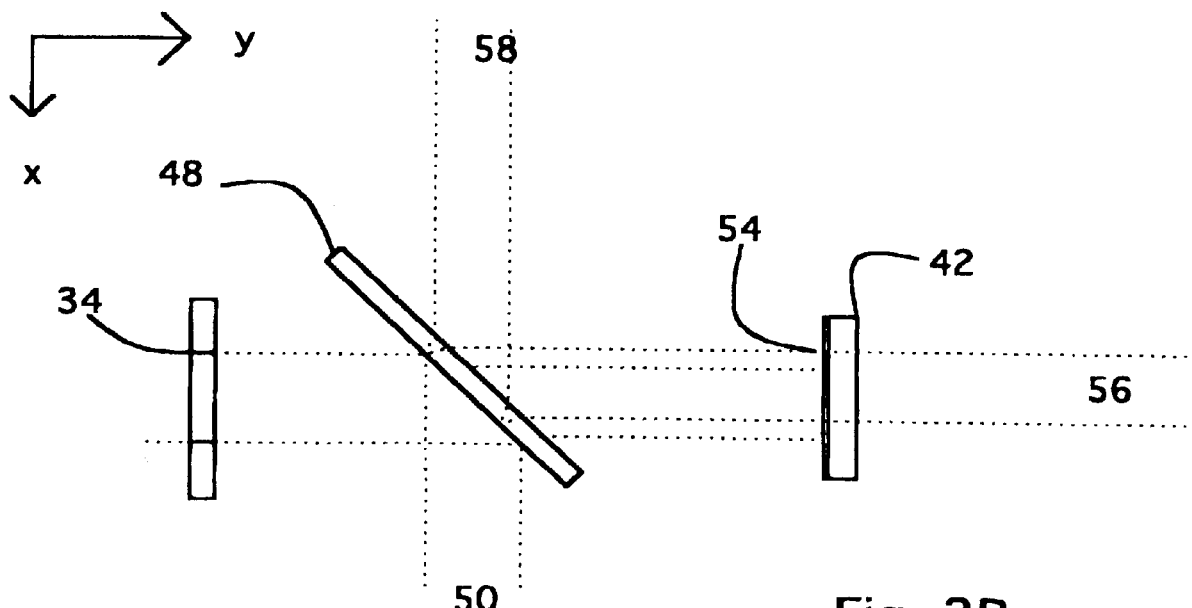
FIG. 3B is an orthographic, schematic view of the system of FIG. 2 looking along the z axis, i.e., a top plan view of the system shown in FIG. 2.

FIGS. 3A and 3B illustrate the five beam generation process of FIG. 2 by showing orthographic views with artificial beam separation. Corresponding elements have the same number designation as in FIG. 2.

The above described preferred embodiments are intended to illustrate the principles of the invention, but not to limit its scope. Other embodiments and variations to this preferred embodiment will be apparent to those skilled in the art and may be made without departing from the spirit and scope of the invention as defined in the following claims.

We claim:

1. A system producing a plurality of light beams on orthogonal and intersecting lines, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, mask means for masking the substantially collimated beam into a plurality of separate, parallel beams lying essentially in a common plane with said long axis, a plurality of reflective surfaces positioned obliquely in the paths of the parallel beams so as to reflect the parallel beams to produce a plurality of substantially orthogonal output beams, and wherein the mask means includes three openings so as to produce three said separate, parallel beams, and wherein the reflective surfaces include two reflectors each oriented substantially at 45° to the beams and in the path of two outer beams of the three beams, so as to produce two oppositely directed output beams on essentially the same line, and a third reflector oriented substantially at 45° and in the path of the remaining, middle beam, the third reflector being oriented to produce a third orthogonal beam on a line which intersects the other two oppositely directed beams and substantially at 90° to the other two beams.

2. The system of claim 1, wherein the third reflector is partially transmissive, so that the middle parallel beam produces a fourth orthogonal output beam on the same line as the middle parallel beam.

3. The system of claim 2, further including a partially transmissive reflector oriented at 90° to and in the path of the third orthogonal beam, so as to reflect back a portion of the third orthogonal beam, through the third reflector, to produce a fifth orthogonal beam which is essentially on a common line with the third orthogonal beam and at 90° to the other orthogonal beams.

4. A system producing a plurality of light beams on orthogonal and intersecting lines, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, mask means for masking the substantially collimated beam into a plurality of separate, parallel beams lying essentially in a common plane with said long axis, a plurality of reflective surfaces positioned obliquely in the paths of the parallel beams so as to reflect the parallel beams to produce a plurality of substantially orthogonal output beams, the mask means including two openings in a pattern aligned substantially with said long axis, the system including two said reflective surfaces, a first positioned essentially at 45° to and in the path of a first of the two parallel beams to produce a first output beam, and a second reflective surface being positioned essentially at 45° to and in the path of a second of the two parallel beams, to produce a second output beam essentially orthogonal to the first output beam, the second reflective surface being partially transmissive, to produce a third output beam aligned with the second of said parallel beams and orthogonal to the first and second output beams, and wherein the second reflective surface comprises a second reflector having a reflective back surface, and the system further including a partially reflective mirror in the path of and perpendicular to the third output beam, whereby the third output beam is partially reflected back along its own path to the reflective back surface of the second reflector to produce a fourth output beam aligned generally with and projected in an opposite direction from the second output beam, all of the first through fourth beams being essentially orthogonal.

5. The system of claim 4, wherein the first reflective surface comprises a partially transmissive first mirror having a reflective back surface, so that a portion of the first of the two parallel beams is transmitted through the first mirror, and the system further including a mirror positioned at 90° to and in the path of the transmitted portion of the first parallel beam, so that the transmitted portion is reflected back along its own path and is then reflected by the back surface of the first mirror to produce a fifth orthogonal output beam oppositely directed to the first output beam, all of the output beams being orthogonal to one another.

6. A system producing a plurality of light beams on orthogonal and intersecting lines, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, mask means for masking the substantially collimated beam into a plurality of separate, parallel beams lying essentially in a common plane with said long axis, a plurality of reflective surfaces positioned obliquely in the paths of the parallel beams so as to reflect the parallel beams to produce a plurality of substantially orthogonal output beams, the mask means including two openings in a pattern aligned substantially with said long axis, the system including two said reflective surfaces, a first positioned essentially at 45° to and in the path of a first of the two parallel beams to produce a first output beam, and a second reflective surface being positioned essentially at 45° to and in the path of a second of the two parallel beams, to produce a second output beam essentially orthogonal to the first output beam, the second reflective surface being partially transmissive, to produce a third output beam aligned with the second of said parallel beams and orthogonal to the first and second output beams, and wherein the first reflective surface comprises a partially transmissive first mirror having a reflective back surface, so that a portion of the first of the two parallel beams is transmitted through the first mirror, and the system further including a mirror positioned at 90° to and in the path of the transmitted portion of the first parallel beam, so that the transmitted portion is reflected back along its own path and is then reflected by the back surface of the first mirror to produce a further orthogonal output beam oppositely directed to the first output beam, all of the output beams being orthogonal to one another.

7. A system producing a plurality of light beams on orthogonal and intersecting lines, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, and a plurality of reflective surfaces positioned obliquely in the paths of the collimated beams so as to reflect the collimated beams to produce a plurality of substantially orthogonal output beams, said reflective surfaces including two reflectors each oriented substantially at 45° to the beams and in the path of two outer portions of the collimated beam, so as to produce two oppositely directed output beams on essentially the same line, and a third reflector oriented substantially at 45° and in the path of a middle portion of the collimated beam, the third reflector being oriented to produce a third orthogonal beam on a line which intersects the other two oppositely directed beams and substantially at 90° to the other two beams.

8. The system of claim 7, further including transmissive means for providing a fourth beam by transmission, without reflection.

9. The system of claim 8, wherein the transmissive means comprises the third reflector being partially transmissive, so that the middle beam portion produces a fourth orthogonal output beam on essentially the same line as said collimated beam.

* * * * *

UNITED STATES PATENT AND TRADEMARK OFFICE
CERTIFICATE OF CORRECTION

PATENT NO. : 6,005,716
DATED : December 21, 1999
INVENTOR(S) : Christiaan Ligtenberg, Joseph F. Rando, and Timothy J. Litvin It is certified that error appears in the above-identified patent and that said Letters Patent is hereby corrected as shown below:

Claim 7 should read --

A system producing a plurality of light beams on orthogonal and intersecting lines, comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, and a plurality of reflective surfaces positioned obliquely in the path[s] of the collimated beam[s] so as to reflect the collimated beam[s] to produce a plurality of substantially orthogonal output beams, said reflective surfaces including two reflectors each oriented substantially at 45° to the beam[s] and in the path of two outer portions of the collimated beam, so as to produce two oppositely directed output beams on essentially the same line, and a third reflector oriented substantially at 45° and in the path of a middle portion of the collimated beam, the third reflector being oriented to produce a third orthogonal beam on a line which intersects the other two

UNITED STATES PATENT AND TRADEMARK OFFICE
CERTIFICATE OF CORRECTION

PATENT NO. : 6,005,716
DATED : December 21, 1999
INVENTOR(S) : Christiaan Ligtenberg, Joseph F. Rando, and Timothy J. Litvin It is certified that error appears in the above-identified patent and that said Letters Patent is hereby corrected as shown below:

oppositely directed beams and substantially at 90° to the other two beams.

Signed and Sealed this

Eighth Day of August, 2000

Attest:

Q. TODD DICKINSON

Attesting Officer

Director of Patents and Trademarks